United States Patent
Chen et al.

(10) Patent No.: US 7,804,475 B2
(45) Date of Patent: Sep. 28, 2010

(54) SYSTEMS FOR DISPLAYING IMAGES UTILIZING TWO CLOCK SIGNALS

(75) Inventors: Jun-Chang Chen, Longjing Township, Taichung County (TW); Chang-Ming Chiu, Jhongli (TW)

(73) Assignee: Toppoly Optoelectronics Corp., Chu-Nan, Miao-Li County (TW)

( * ) Notice: Subject to any disclaimer, the term of this patent is extended or adjusted under 35 U.S.C. 154(b) by 905 days.

(21) Appl. No.: 11/350,451

(22) Filed: Feb. 9, 2006

(65) Prior Publication Data

US 2007/0182686 A1  Aug. 9, 2007

(51) Int. Cl.
G09G 3/36 (2006.01)
G09G 3/32 (2006.01)

(52) U.S. Cl. .................................... 345/100
(58) Field of Classification Search ........... 345/98–100, 345/76–83; 377/64; 327/241
See application file for complete search history.

(56) References Cited

U.S. PATENT DOCUMENTS

| | | | | |
|---|---|---|---|---|
| 6,157,228 A * | 12/2000 | Yokoyama et al. | .......... | 327/144 |
| 6,426,743 B1 * | 7/2002 | Yeo et al. | .......... | 345/213 |
| 2002/0047822 A1 * | 4/2002 | Senda et al. | .......... | 345/90 |
| 2002/0150199 A1 * | 10/2002 | Sasaki et al. | .......... | 377/64 |
| 2003/0128180 A1 * | 7/2003 | Kim et al. | .......... | 345/100 |
| 2003/0231735 A1 * | 12/2003 | Moon et al. | .......... | 377/64 |
| 2005/0036581 A1 * | 2/2005 | Lin | .......... | 377/54 |
| 2005/0220262 A1 * | 10/2005 | Moon | .......... | 377/64 |
| 2005/0264505 A1 * | 12/2005 | Kim | .......... | 345/87 |
| 2005/0268960 A1 * | 12/2005 | Hiyama et al. | .......... | 136/244 |

FOREIGN PATENT DOCUMENTS

| | | |
|---|---|---|
| CN | 1416109 | 5/2003 |
| CN | 1702497 | 11/2005 |
| JP | 2001-282169 | 10/2001 |
| JP | 2005-338758 | 12/2005 |

OTHER PUBLICATIONS

Jung, A New Low Power PMOS Poly-Si Inverter and Driving Circuits for Active Matrix Displays, 2003, SID 03 DIGEST, 1396-1399.*
Japanese language office action dated Jul. 22, 2010.
English language translation of Japanese language office action.
English language translation of abstract of JP 2001-282169 (published Oct. 12, 2001).
English language translation of abstract of JP 2005-338758 (published Dec. 8, 2005).

* cited by examiner

Primary Examiner—Chanh Nguyen
Assistant Examiner—Robert M Stone
(74) Attorney, Agent, or Firm—Thomas, Kayden, Horstemeyer & Risley (57) ABSTRACT

Systems for displaying images are provided. In this regard, a representative system incorporates a signal driving circuit that includes a plurality of PMOS shift registers connected in series and controlled only by a first clock signal and a second clock signal, wherein the PMOS shift registers are operative to output corresponding driving pulses in turn after receiving a start pulse.

14 Claims, 6 Drawing Sheets

SYSTEMS FOR DISPLAYING IMAGES UTILIZING TWO CLOCK SIGNALS

BACKGROUND

The invention relates to the display of images.

High definition, multicolor display, low power consumption, lower voltage requirements and light weight have made liquid crystal displays (LCDs) a leading display device technology. LCDs have been used for several years as mobile information displays in, for example, personal digital assistants (PDAs), portable computers, mobile phones, and the like.

Recently, CMOS shift register circuits have been widely applied in Low Temperature Poly Silicon (LTPS) LCDs. However, at least eight masks are required to form the CMOS shift register circuit during fabrication, and thus, the costs are increased. For cost reduction, PMOS shift registers, which require fewer masks, are used frequently by LCD makers.

Figure 1:
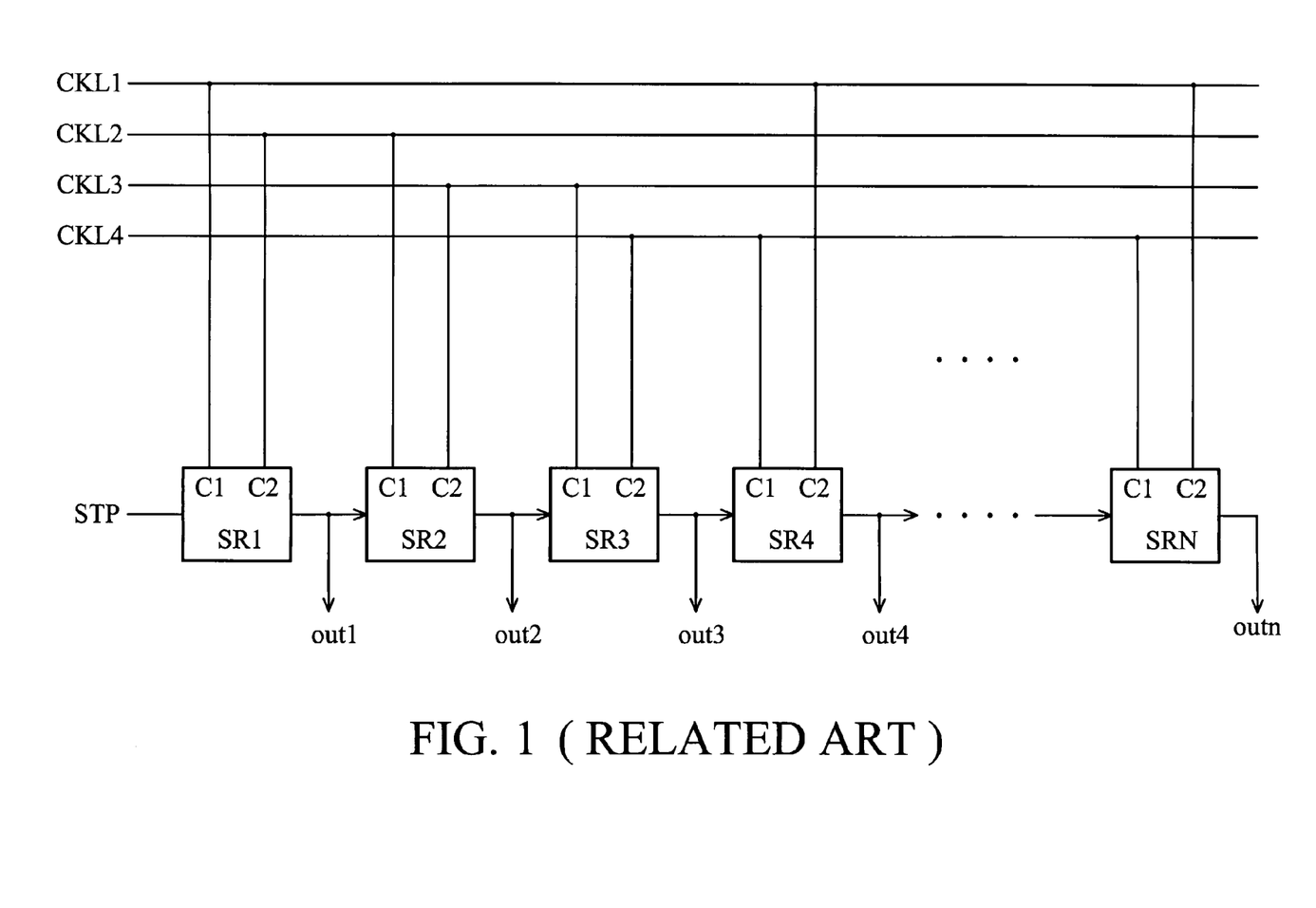
FIG. 1 shows a conventional signal driving circuit having PMOS shift registers.

FIG. 1 shows a conventional signal driving circuit comprising PMOS shift registers. The PMOS shift registers shown, however, require four clock signals provided by an external application specific integrated circuit (ASIC) (not shown). Because of the increased clock signals, ASICs required the use of PMOS shift registers typically are more expensive.

SUMMARY

Systems for displaying images are provided. In this regard, an exemplary embodiment of such a system comprises: a signal driving circuit, comprising a plurality of PMOS shift registers connected in series and controlled only by a first clock signal and a second clock signal, wherein the PMOS shift registers are operative to output corresponding driving pulses in turn after receiving a start pulse.

Another embodiment of such a system comprises: a display device comprising a signal driving circuit comprising a plurality of PMOS shift registers connected in series and controlled only by a first clock signal and a second clock signal, wherein the PMOS shift registers are operative to output corresponding driving pulses in turn after receiving a start pulse; and a display element coupled to the signal driving circuit, wherein the display element is driven by the signal driving circuit.

DESCRIPTION OF THE DRAWINGS

The invention can be more fully understood by the subsequent detailed description and examples with reference made to the accompanying drawings, wherein.

DETAILED DESCRIPTION

Figure 2:
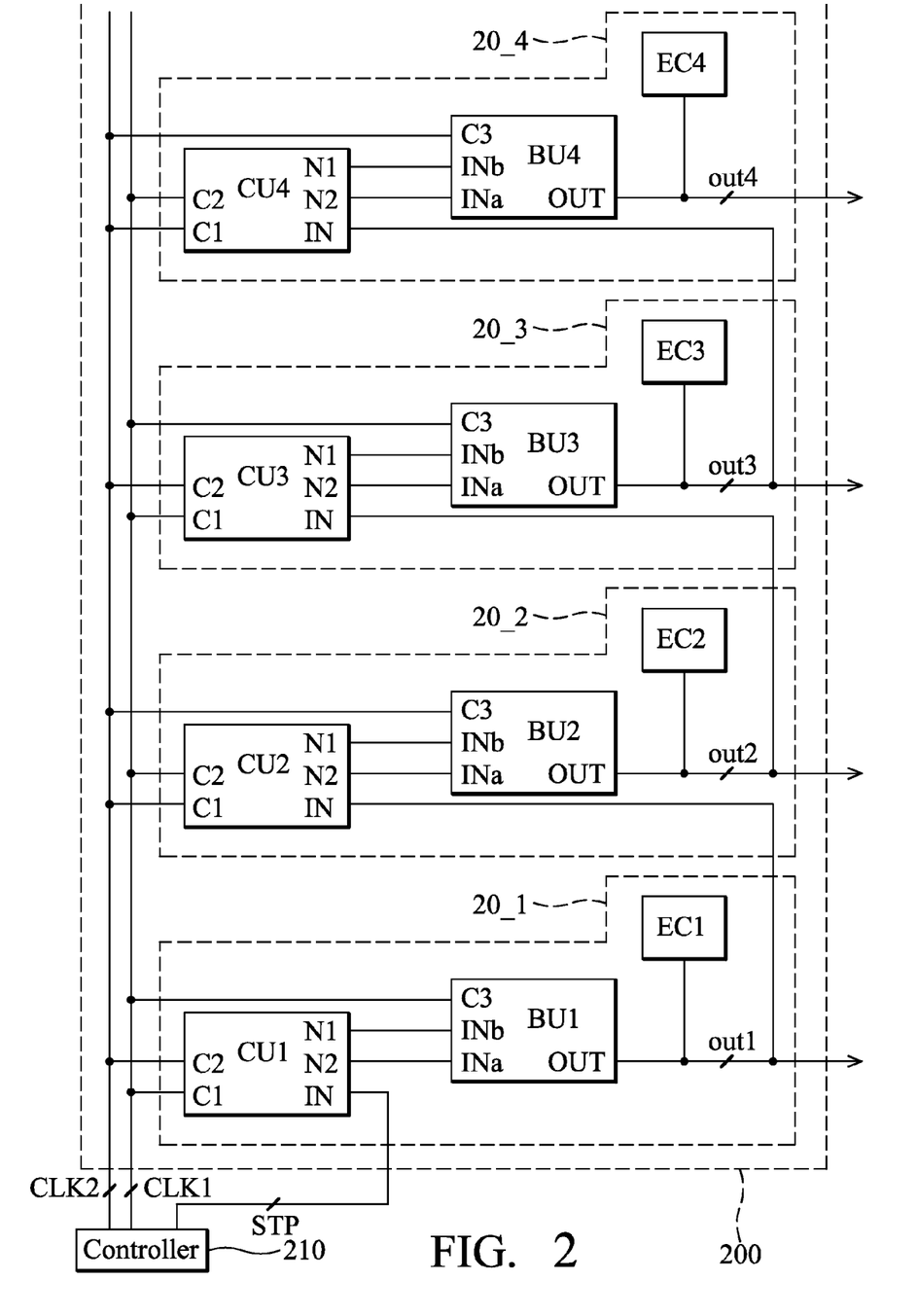
FIG. 2 shows an embodiment of a system for displaying images incorporating a signal driving circuit.

FIG. 2 shows a first embodiment of a system for displaying images that includes an embodiment of a signal driving circuit. As shown, signal driving circuit 200 comprises a plurality of shift registers 20_1~20_4 connected in series. While this embodiment discloses a signal driving circuit with four shift registers, it is to be understood that the invention is not limited thereto. Each shift register 20_1~20_4 comprises a first control terminal C1, a second control terminal C2, a third control terminal C3, an input terminal IN and an output terminal OUT. The shift registers 20_1~20_4 are controlled by a first clock signal CLK1 and a second clock signal CLK2 to output corresponding driving pulses, in turn, after receiving a start pulse STP. It is to be noted that the first clock signal CLK1 and the second clock signal CLK2 are not inverse to each other, but have a phase difference therebetween.

In this embodiment, the signal driving circuit 200 is integrated into a display panel. A controller 210 provides the clock signals CLK1 and CLK2 and the start pulse STP. The controller 210 may be a part of, or the clock signals and the start pulse STP may be provided by, timing controller 420 found in an electronic device (see FIG. 6), for example. The controller 210 can, for example, be an application specific integrated circuit (ASIC).

In shift register 20_1, a first control terminal C1 is coupled to the first clock signal CLK1, second control terminal C2 is coupled to the second clock signal CLK2, third control terminal C3 is coupled to the first clock signal CLK2, and the input terminal is coupled to the start pulse STP such that the output terminal is operative to output a corresponding driving pulse out1. In shift register 20_2, a first control terminal C1 is coupled to the second clock signal CLK2, second control terminal C2 is coupled to first clock signal CLK1, third control terminal C3 is coupled to the second clock signal CLK2, and the input terminal is coupled to the output terminal of the shift register 20_1 such that the output terminal is operative to output a corresponding driving pulse out2.

In shift register 20_3, the first control terminal C1 is coupled to the first clock signal CLK1, second control terminal C1 is coupled to the second clock signal CLK2, third control terminal C3 is coupled to the first clock signal CLK1, and the input terminal is coupled to the output terminal of the shift register 20_2 such that the output terminal is operative to output a corresponding driving pulse out3. In shift register 20_4, a first control terminal C1 is coupled to the second clock signal CLK2, second control terminal C2 is coupled to first clock signal CLK1, third control terminal C3 is coupled to the second clock signal CLK2, and the input terminal is coupled to the output terminal of the shift register 20_3 such that the output terminal is operative to output a corresponding driving pulse out4.

Figure 3:
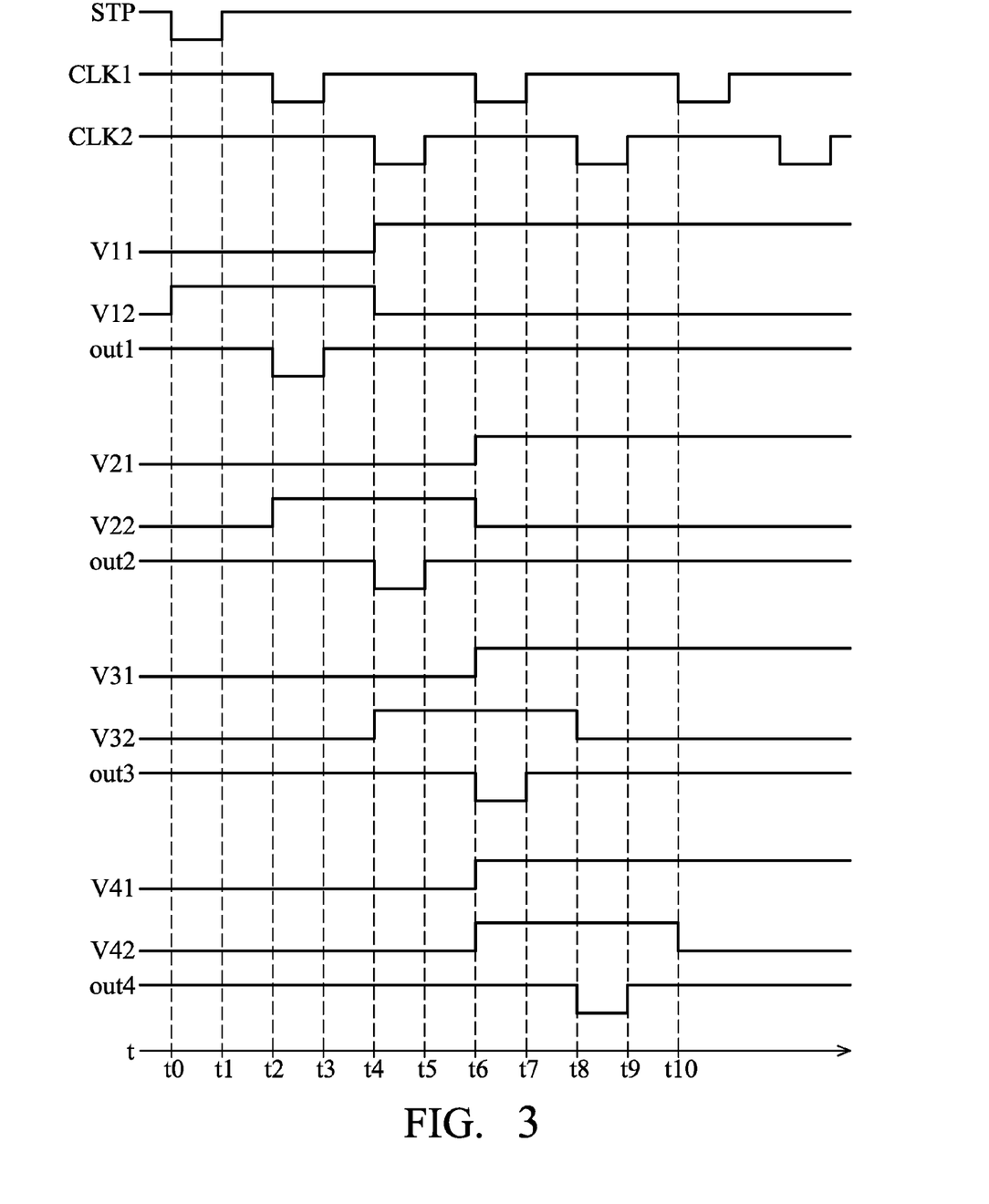
FIG. 3 is a timing chart of the driving signal circuit of FIG. 2.

FIG. 3 is a timing chart of the driving signal circuit 200 of FIG. 2. In this regard, shift register 20_1 generates driving pulse out1 for output to the input terminal of the shift register 20_2 after receiving the start pulse STP. For example, after receiving the start pulse STP at time t0, the shift register 20_1 outputs driving pulse out1 when the clock signal CLK1 goes low at time t2.

The shift register 20_2 generates driving pulse out2 for output to the input terminal of the shift register 20_3, according to the second clock signal CLK2 after receiving the driving pulse out1 from the shift register 20_1. For example, after receiving the driving pulse out1 from the shift register 20_1, the shift register 20_2 outputs driving pulse out2 when the clock signal CLK2 goes low at time t4. Similarly, the shift registers 20_3 and 20_4 generate and output driving pulses out3 and out4, respectively, according to the driving pulse from the previous stage and the clock signals CLK1 or CLK2. Namely, the shift registers 20_1~20_4 are controlled by the clock signals CLK1 and CLK2 and output corresponding driving pulses out1-out4 in sequence to drive scan lines of a pixel array (not shown) after receiving the start pulse STP.

Here, the shift registers 20_1~20_4 have the same structure, and are formed by PMOS transistors solely. Each shift register 20_1~20_4 comprises a control unit CU1~CU4, a buffering unit BU1~BU4, and an electrostatic discharge (ESD) circuit EC1~EC4 (see FIG. 2, for example).

Control units CU1~CU4 are each coupled to the first clock signal CLK1 and the second clock signal CLK2, generating two control signals Vn1 and Vn2 (see FIGS. 3 and 4) when receiving the corresponding start pulse out1~out4. For example, the control unit CU1 generates control signals V11 and V12, and the control unit CU2 generates control signals V21 and V22, and so on. The buffering units BU1~BU4 are each coupled to one of the first clock signal CLK1 and second clock signal CLK2, outputting the coupled clock signal (CLK1 or CLK2) to serve as the corresponding driving pulse out1~out4, according to the two control signals from the control unit BU1~BU4. The electrostatic discharge (ESD) circuits EC1~EC4 are coupled to output terminals of the buffering units BU1~BU4, respectively, for providing electrostatic discharge protection.

Figure 4:
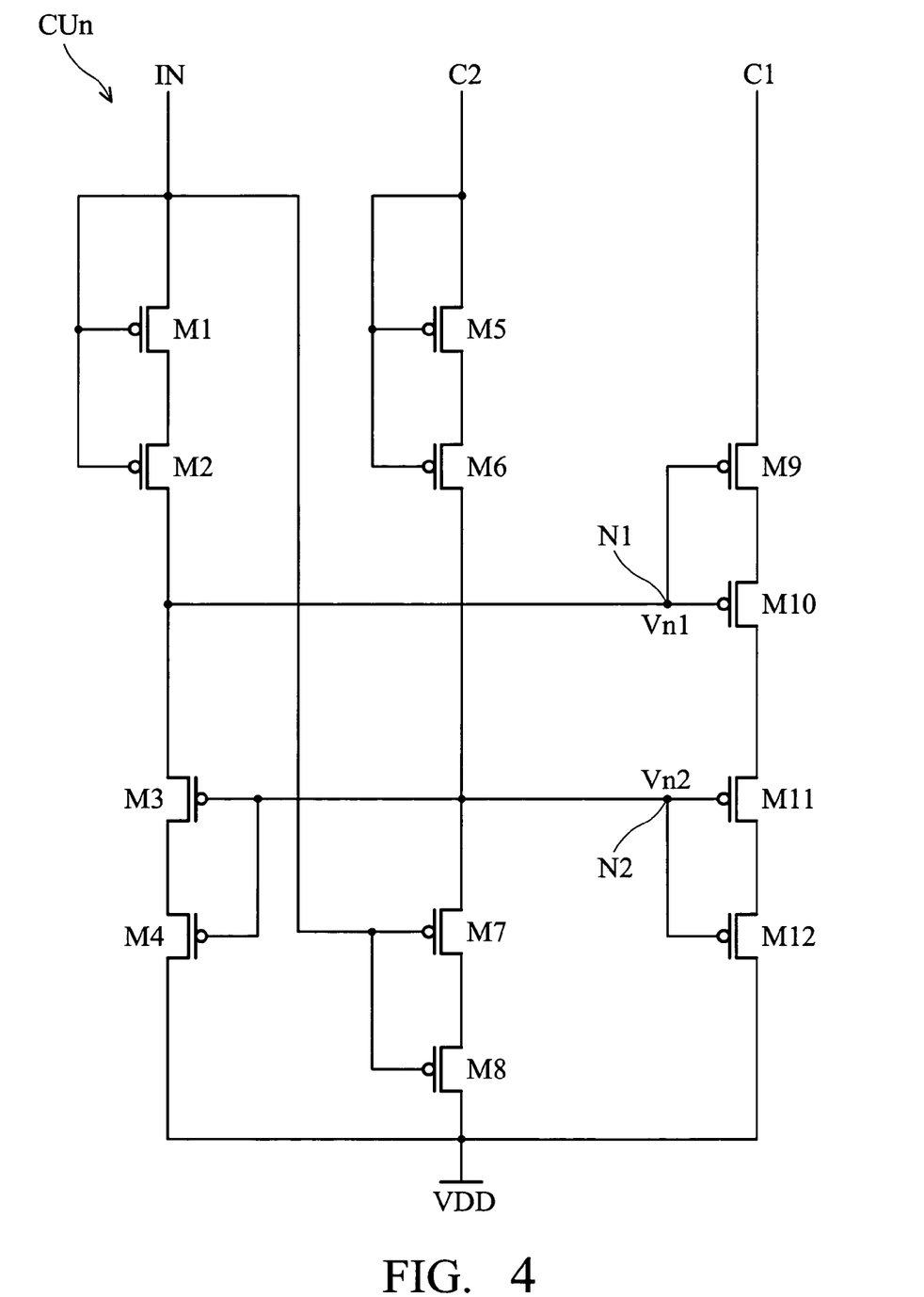
FIG. 4 shows an embodiment of a control unit.

FIG. 4 shows an embodiment of the control unit CUn (CU1~CU4), in which the control unit CUn comprises 12 PMOS transistors. In this regard, the transistor M1 comprises a control terminal serving as an input terminal IN, a first terminal coupled to the input terminal IN and a second terminal coupled to the transistor M2. The transistor M2 comprises a control terminal coupled to the input terminal IN, a first terminal coupled to the second terminal of the transistor M1 and a second terminal coupled to a node N1. The transistor M3 comprises a first terminal coupled to the node N1, a control terminal coupled to a node N2, and a second terminal coupled to the transistor M4. The transistor M4 comprises a first terminal coupled to the second terminal of the transistor M3, a control terminal coupled to a node N2, and a second terminal coupled to a power voltage VDD.

The transistor M5 comprises a first terminal serving as a second terminal C2, a control terminal coupled to the second terminal C2, and a second terminal coupled to the transistor M6. The transistor M6 comprises a first terminal coupled to the second terminal of the transistor M5, a control terminal coupled to the second terminal C2, and a second terminal coupled to the node N2. The transistor M7 comprises a first terminal coupled to the node N2, a control terminal coupled to the input terminal IN, and a second terminal coupled to the transistor M8. The transistor M8 comprises a first terminal coupled to the second terminal of the transistor M7, a control terminal coupled to the input terminal IN, and a second terminal coupled to the power voltage VDD.

The transistor M9 comprises a first terminal serving as a first control terminal C1, a control terminal coupled to the node N1, and a second terminal coupled to the transistor M10. The transistor M10 comprises a first terminal coupled to the second terminal of the transistor M9, a control terminal coupled to the node N1, and a second terminal coupled-to the transistor M11. The transistor M11 comprises a first terminal coupled to the second terminal of the transistor M10, a control terminal coupled to the node N2, and a second terminal coupled to the transistor M12. The transistor M12 comprises a first terminal coupled to the second terminal of the transistor M11, a control terminal coupled to the node N2, and a second terminal coupled to the power voltage VDD.

It should be noted that the two control terminals C1 and C2 in the shift registers 20_1 and 20_3 are coupled to the clock signal CLK1 and CLK2 respectively, and the two control terminals C1 and C2 in the shift registers 20_2 and 20_4 are coupled to the clock signal CLK2 and CLK1 respectively. Further, the voltages at the nodes N1 and N2 in the shift registers 20_1 are V11 and V21, the voltages at the nodes N1 and N2 in the shift registers 20_2 are V21 and V22, and the voltages at the nodes N1 and N2 in the shift registers 20_3 are V31 and V31, and so on. In this embodiment, the voltages V1n and V2n at the nodes N1 and N2 in the shift registers 20_~20_4 serve as the control signals output to terminals INa and INb of the corresponding buffering unit BU1~BU4.

Figure 5:
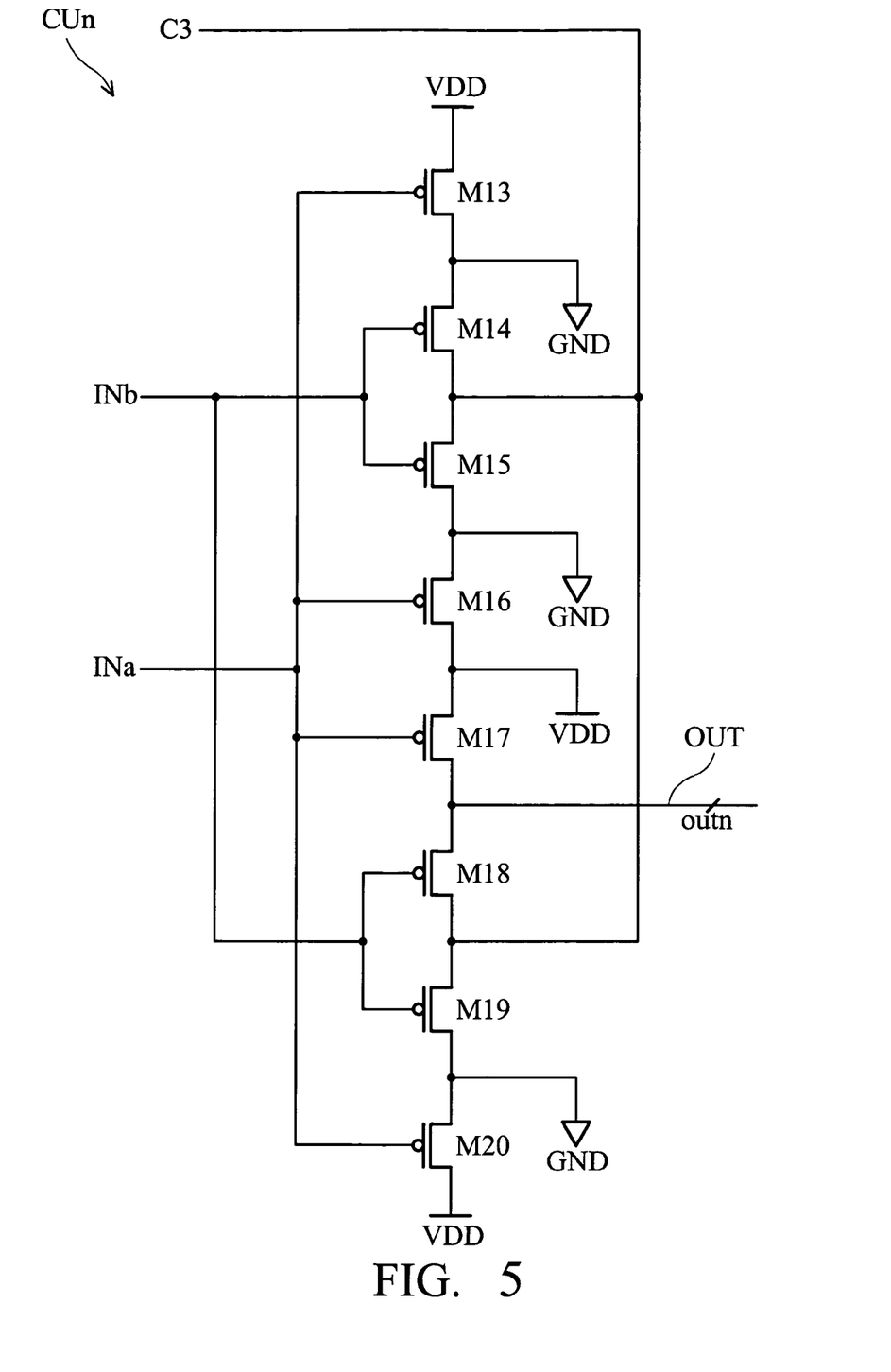
FIG. 5 shows an embodiment of a buffering unit.

FIG. 5 shows an embodiment of the buffering unit BUn (BU1~BU4), in which the control unit BUn comprises 8 PMOS transistors. In this regard, the transistor M13 comprises a first terminal coupled to the power voltage VDD, a control terminal coupled to the terminal INa, and a second terminal coupled to a ground voltage GND. The transistor M14 comprises a first terminal coupled to the ground voltage GND, a control terminal coupled to the terminal INb, and a second terminal coupled to the third control terminal C3. The transistor M15 comprises a first terminal coupled to the third control terminal C3, a control terminal coupled to the terminal INb, and a second terminal coupled to the ground voltage GND. The transistor M16 comprises a first terminal coupled to the ground voltage GND, a control terminal coupled to the terminal INa, and a second terminal coupled to the power voltage VDD.

The transistor M17 comprises a first terminal coupled to the power voltage VDD, a control terminal coupled to the terminal INa, and a second terminal served as an output terminal. The transistor M18 comprises a first terminal coupled to the output terminal, a control terminal coupled to the terminal INb, and a second terminal coupled to the third control terminal C3. The transistor M19 comprises a first terminal coupled to the third control terminal C3, a control terminal coupled to the terminal INb, and a second terminal coupled to the ground voltage GND. The transistor M20 comprises a first terminal coupled to the ground voltage GND, a control terminal coupled to the terminal INa, and a second terminal coupled to the power voltage VDD.

It should be noted that the control terminals C3 in the shift registers 20_1 and 20_3 are coupled to the clock signal CLK1, and the control terminals C3 in the shift registers 20_2 and 20_4 are coupled to the clock signal CLK2.

Operations of the control unit CUn shown in FIG. 4 and the buffering unit BUn shown in FIG. 5 are follow with reference to the timing chart in FIG. 3.

At time t0:

In the shift register 20_1, the transistors M1, M2, M7, M8, M9 and M10 are turned on and the transistors M3, M4, M11 and M12 are turned off, because the start pulse STP goes low. Meanwhile, the transistors M5 and M6 are turned off because the clock signal CLK2 stays high. Thus, the shift register 20_1 is enabled, and the voltage V12 at the node N2 goes high while the voltage V11 at the node N1 stays low.

Because the voltages V11 and V12 at the node N1 and N2 are low and high respectively, the transistors M13, N16, M17 and M20 are turned off and the transistors M14, M15, M18 and M19 are turned on. As the transistor M18 is turned on, the clock signal CLK1 coupled to the third control terminal C3 serves as a driving pulse out1 and is output to the shift register 20_2. The driving pulse out1 stays high because the clock signal CLK1 stays high. It is to be noted that because the clock signals CLK1 and CLK2 are provided by the controller 210 with driving power exceeding all transistors M1~M20 in the signal driving circuit 200, the driving pulse out1 stays high even if the transistor M19 is turned on.

The shift registers 20_2~20_4 are disabled because no corresponding start pulse is input to the shift registers 20_2~20_4 at this time.

At time t1:

In shift register 20_1, the transistors M9 and M10 stay on, the transistors M1, M2, M7 and M8 are turned off, and the transistors M3, M4, M5, M6, M11 and M12 stay off because the start pulse STP goes high. Thus, the voltage V11 at the node N1 and the voltage V12 at the node N2 stay low and high respectively, and the driving pulse out1 stays high because the clock signals CLK1 and CLK2 stay high.

The shift registers 20_2~20_4 are still disabled because no corresponding start pulse is input to the shift registers 20_2~20_4 at this time.

At time t2:.

In the shift register 20_1, the transistors M1~M8 and M11~M12 stay off and the transistors M9 and M10 stay on because the clock signal CLK1 goes low. Thus, the voltage V11 at the node N1 and the voltage V12 at the node N2 stay low and high respectively, but the driving pulse out1 output by the buffering unit BU1 goes low because clock signal CLK1 goes low.

Concurrently, the shift register 20_2 is enabled, the voltage V22 at the node N2 goes high and the voltage V21 at the node N1 stays low in the control unit CU2. Because the voltages V21 and V22 at the node N1 and N2 in the control unit CU2 are low and high respectively, the transistors M13, N16, M17 and M20 are turned off and the transistors M14, M15, M18 and M19 are turned on, in the buffering unit BU2. Thus, in the buffering unit BU2, the clock signal CLK2 coupled to the third control terminal C3 serves as a driving pulse out2 and is output to the shift register 20_3, as the transistor M18 is turned on. The driving pulse out2 stays high because the clock signal CLK2 stays high.

The shift registers 20_3~20_4 are still disabled because no corresponding start pulse is input to the shift registers 20_2~20_4 at this time.

At time t3:

In the shift register 20_1, the transistors M1~M8 and M11~M12 stay off and the transistors M9 and M10 stay on because the clock signal CLK1 goes high. Thus, the voltage V11 at the node N1 and the voltage V12 at the node N2 still stay low and high respectively, but the driving pulse out1 output from the buffering unit BU1 goes high.

Concurrently, the voltage V21 at the node N1 and the voltage V22 at the node N2 in the shift register 20_2 stay low and high respectively, and the driving pulse out2 stays high because the clock signal CLK1 goes high and the clock signal CLK2 stays high.

The shift registers 20_3~20_4 are still disabled because no corresponding start pulse is input to the shift registers 20_2~20_4 at this time.

At Time t4:

In the shift register 20_1, the transistors M5 and M6 are turned on, and the voltage V12 at the node N2 goes low such that the transistors M3~M4 and M11~M12 are turned on, because the clock signal CLK2 goes low. The transistors M1~M2 and M7~M8 stay off because the start pulse STP stays high. As the transistors M3 and M4 are turned on, the voltage V11 at the node N1 goes high, such that the transistors M9 and M10 stay off. Because the voltage V11 at the node N1 and the voltage V12 at the node N2 stay high and low respectively, the, transistors M14~M15 and M18~M19 are turned off such that the clock signal CLK1 does not serve as the driving pulse out1. Namely, the shift register 20_1 is reset by the clock signal CLK2.

Concurrently, the transistors M1~M8 and M11~M12 in the shift register 20_2 stay off and the transistors M9 and M10 stay on. Thus, the voltage V21 at the node N1 and the voltage V22 at the node N2 in the buffering unit BU2 stay low and high respectively, but the driving pulse out2 output by the buffering unit BU2 goes low because the clock signals CLK2 goes low.

Concurrently, the shift register 20_3 is enabled because the driving pulse out2 from shift register 20_2 goes low. In the shift register 20_2, the voltage V32 at the node N2 goes high and the voltage V31 at the node N1 stays low. Because the voltages V31 and V32 at the node N1 and N2 in the control unit CU3 are low and high respectively, the transistors M13, N16, M17 and M20 are turned off and the transistors M14, M15, M18 and M19 are turned on. Thus, the clock signal CLK2 coupled to the third control terminal C3 serves as a driving pulse out3 and is output to the shift register 20_4, as the transistor M18 is turned on. The driving pulse out3 stays high because the clock signal CLK1 stays high.

The shift register 20_4 is still disabled because no start pulse is input to the shift registers 20_4 at this time.

At Time t5:

In the shift register 20_2, the transistors M1~M8 and M11~M12 stay off and the transistors M9 and M10 stay on because the clock signal CLK2 goes high. The voltage V21 at the node N1 and the voltage V22 at the node N2 still stay low and high respectively, but the driving pulse out2 output from the buffering unit BU2 goes high.

Meanwhile, the voltage V31 at the node N1 and the voltage V32 at the node N2 in the shift register 20_3 stay low and high respectively, and the driving pulse out3 stays high because the clock signal CLK2 goes high and the clock signal CLK1 stays high.

The shift register 20_4 is still disabled because no start pulse is input to the shift register 20_4 at this time.

At Time t6:

In the shift register 20_2, the transistors M5 and M6 are turned on, and the voltage V22 at the node N2 goes low such that the transistors M3~M4 and M11~M12 are turned on, because the clock signal CLK1 goes low. The transistors M1~M2 and M7~M8 stay because the driving pulse out1 stays high.

As the transistors M3 and M4 are turned on, the voltage V21 at the node N1 goes high, such that the transistors M9 and M10 stay off. Because the voltage V21 at the node N1 and the voltage V22 at the node N2 stay high and low respectively, the transistors M14~M15 and M18~M19 are turned off such that the clock signal CLK2 does not serve as the driving pulse out2. Namely, the shift register 20_2 is reset by the clock signal CLK1.

Concurrently, the transistors M1~M8 and M11~M12 in the shift register 20_3 stay off and the transistors M9 and M10 stay on. Thus, the voltage V31 at the node N1 and the voltage V32 at the node N2 in the buffering unit BU3 stay low and high respectively, but the driving pulse out3 output by the buffering unit BU3 goes low because the clock signal CLK1 goes low.

Concurrently, the shift register 20_4 is enabled because the driving pulse out3 from shift register 20_3 goes low. In the shift register 20_4, the voltage V42 at the node N2 goes high and the voltage V41 at the node N1 stays low. Because the voltages V41 and V42 at the node N1 and N2 in the control unit CU4 are low and high respectively, the transistors M13, N16, M17 and M20 are turned off and the transistors M14, M15, M18 and M19 are turned on. Thus, the clock signal CLK2 coupled to the third control terminal C3 serves as a driving pulse out4 and is output to the next shift register (not shown), as the transistor M18 is turned on. The driving pulse out4 stays high because the clock signal CLK2 stays high.

At Time t7:

In the shift register 20_3, the transistors M~M8 and M11~M12 stay off and the transistors M9 and M11 stay on because the clock signal CLK1 goes high: Thus, the voltage V31 at the node N1 and the voltage V32 at the node N2 still stay low and high respectively, but the driving pulse out3 output from the buffering unit BU3 goes high.

Concurrently, the voltage V41 at the node N1 and the voltage V42 at the node N2 in the shift register 20_4 stay low and high respectively, and the driving pulse out4 stays high because the clock signal CLK1 goes high and the clock signal CLK2 stays high.

At Time t8:

In the shift register 20_3, the transistors M5 and M6 are turned on, and the voltage V32 at the node N2 goes low such that the transistors M3~M4 and M11~M12 are turned on, because the clock signal CLK2 goes low. The transistors M1~M2 and M7~M8 stay off because the driving pulse out2 stays high.

As the transistors M3 and M4 are turned on, the voltage V31 at the node N1 goes high, such that the transistors M9 and M10 stay off. Because the voltage V31 at the node N1 and the voltage V32 at the node N2 stay high and low respectively, the transistors M14~M15 and M18~M19 are turned off such that the clock signal CLK1 does not serve as the driving pulse out3. Namely, the shift register 20_3 is reset by the clock signal CLK2.

Concurrently, the transistors M1~M8 and M11~M12 in the shift register 20_4 stay off and the transistors M9 and M10 stay on. Thus, the voltage V41 at the node N1 and the voltage V42 at the node N2 in the buffering unit BU4 stay low and high respectively, but the driving pulse out4 output by the buffering unit BU4 goes low because clock signal CLK2 goes low.

At Time t9:

In the shift register 20_4, the transistors M1~M8 and M11~M12 stay off and the transistors M9 and M10 stay on because the clock signal CLK2 goes high. Thus, the voltage V41 at the node N1 and the voltage V42 at the node N2 still stay low and high respectively, but the driving pulse out4 output from the buffering unit BU4 goes high.

At Time t10:

In the shift register 20_4, the transistors M5 and M6 are turned on, and the voltage V42 at the node N2 goes low such that the transistors M3~M4 and M11~M12 are turned on, because the clock signal CLK1 goes low. The transistors M1~M2 and M7~M8 stay off because the driving pulse out4 stays high.

As the transistors M3 and M4 are turned on, the voltage V41 at the node N1 goes high, such that the transistors M9 and M10 stay off. Because the voltage V41 at the node N1 and the voltage V42 at the node N2 stay high and low respectively, the transistors M14~M15 and M18~M19 are turned off such that the clock signal CLK2 does not serve as the driving pulse out4. Namely, the shift register 20_4 is reset by the clock signal CLK1.

Thus, the signal driving circuit of the present invention outputs clock signals CLK1 or CLK2 in turn to serve as corresponding driving pulses. Because the signal driving circuit of the embodiment of the invention requires only two clock signals and is formed by PMOS shift registers, it incurs lower costs than conventional signal driving circuits with CMOS shift registers and those requiring four clock signals.

Figure 6:
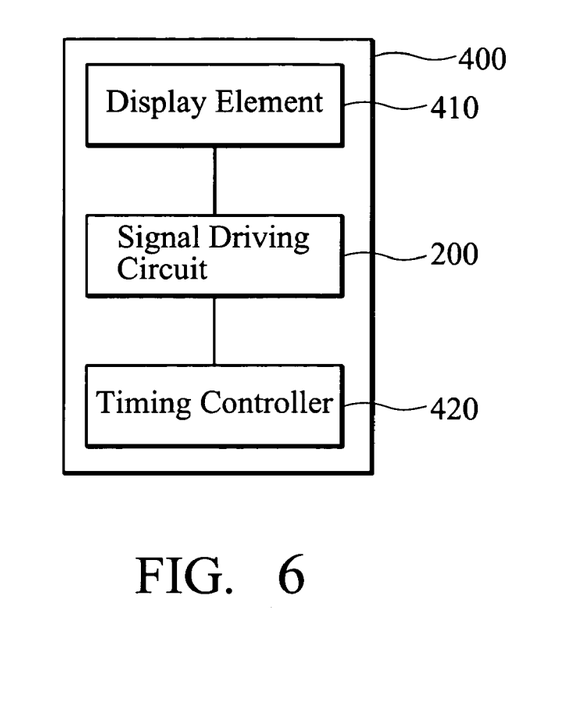
FIG. 6 shows another embodiment of a system for displaying images.

As shown in FIG. 6, another embodiment of a system for displaying images is depicted that is implemented as a display device. As shown in FIG. 6, display device 400 comprises a signal driving circuit such as the described signal driving circuit 200, a display element 410 and a timing controller 420. In the display device 400, the display element 410, such as an LCD element, is operatively coupled to the signal driving circuit 200. The signal driving circuit outputs a plurality of driving pulses in turn to drive display element 410. The timing controller 420 provides clock signals and a start pulse to the signal driving circuit 200. Display element 410 can also be, for example, a plasma display element, an organic light emitting display element, or a cathode ray tube display element in other embodiments.

Figure 7:
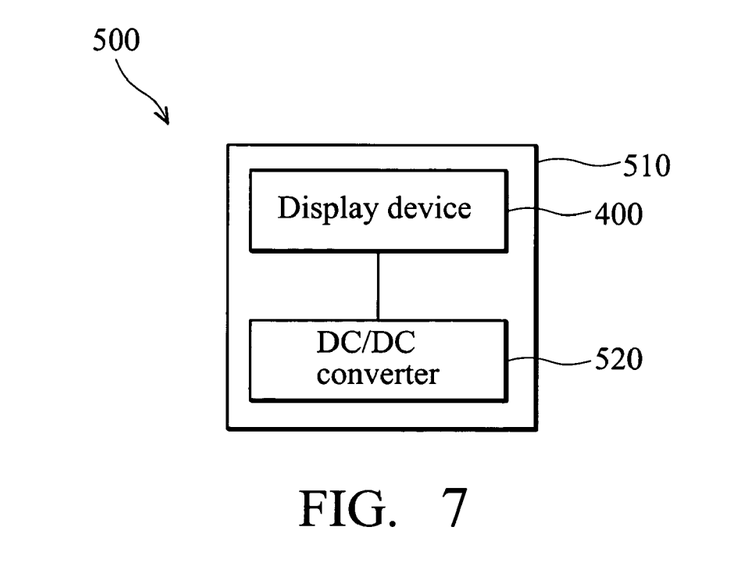
FIG. 7 shows still another embodiment of a system for displaying images.

FIG. 7 schematically shows another embodiment of a system for displaying images which, in this case, is implemented as an electronic device 500. Device 500 comprises a display device, such as display device 400, which can be a liquid crystal display system, an organic light-emitting diode (OLED) display system, or a field emission display (FED) system, although it is to be understood that the invention is not limited thereto. The electronic device 500 may be a digital camera, a portable DVD, a television, a car display, a PDA, notebook computer, tablet computer, cellular phone, or a display device, etc. Generally, the electronic device 500 includes a housing 510, the display device 400 and a DC/DC converter 520. The DC/DC converter 520 is operatively coupled to the display device 400 and provides an output voltage powering the display device 400 to display images.

While the invention has been described by way of example and in terms of preferred embodiment, it is to be understood that the invention is not limited thereto. To the contrary, it is intended to cover various modifications and similar arrangements (as would be apparent to those skilled in the art).

What is claimed is:

1. A system for displaying images, comprising:
 a signal driving circuit, comprising:
  a plurality of PMOS shift registers connected in series and controlled only by a first clock signal and a second clock signal, wherein the PMOS shift registers are operative to output corresponding driving pulses in turn after receiving a start pulse;
 wherein the corresponding driving pulse output from an $N^{th}$ register of the PMOS shift registers is output to an $N+1^{th}$ register of the PMOS shift registers and serves as a corresponding start pulse of the $N+1^{th}$ register of the PMOS shift registers, the $N^{th}$ register of the PMOS shift registers outputs a corresponding driving pulse based on the first clock signal responsive to receiving a corresponding driving pulse from an $N-1^{th}$ register of the PMOS shift registers, and the $N+1^{th}$ register of the PMOS shift registers outputs a corresponding driving pulse based on the second clock signal responsive to receiving a corresponding driving pulse from the $N^{th}$ register of the PMOS shift registers, and the PMOS shift registers each comprise:
  a control unit comprising:
   a first switch element having a first connecting terminal coupled to one of the first and second clock signals, a second connecting terminal, and a control terminal coupled to a first node;
   a second switch element having a first connecting terminal coupled to the second connecting terminal of the first switch element, a second connecting terminal coupled to a supply voltage, and a control terminal coupled to a second node;

a third switch element having a first connecting terminal coupled to the other of the first and second clock signals, a second connecting terminal coupled to the second node, and a control terminal coupled to the first connecting terminal thereof;

a fourth switch element having a first connecting terminal coupled to the start pulse or the corresponding start pulse, a second connecting terminal coupled to the first node, and a control terminal coupled to the first connecting terminal thereof;

a fifth switch element having a first connecting terminal coupled to the second node, a second connecting terminal coupled to the supply voltage, and a control terminal coupled to the first connecting terminal of the fourth switch element; and a sixth switch element having a first connecting terminal coupled to the first node, a second connecting terminal coupled to the supply voltage, and a control terminal coupled to the first connecting terminal of the fifth switch element;

wherein the control unit is operative to generate first and second control signals at the first and second nodes respectively in response to receiving the start pulse or the corresponding start pulse; and a buffering unit comprising a control terminal coupled to the first clock signal or the second clock signal, and the buffing unit being operative to output the coupled clock signal to serve as the corresponding driving pulse, according to the first and second control signals, wherein the corresponding driving pulse output from the buffer unit in the $N^{th}$ register of the PMOS shift registers is output to the control unit in the $N+1^{th}$ register of the PMOS shift registers and serves as the corresponding start pulse of the $N+1^{th}$ register of the PMOS shift register, wherein each of the first through sixth switch elements comprises a first PMOS transistor connected in series with a second PMOS transistor, and first terminals of the first and second PMOS transistors are coupled together, gates of which are coupled together to serve as the control terminal, and second terminals of first and second PMOS transistors serve as the first and second connecting terminals respectively.

2. The system as claimed in claim 1, wherein the first connecting terminal of the first switch element and the first connecting terminal of the third switch element within the $N^{th}$ shift register are coupled to the first clock signal and the second clock signal respectively, and the first connecting terminal of the first switch element and the first connecting terminal of the third switch element within the $N+1^{th}$ shift register are coupled to the second clock signal and the first clock signal respectively.

3. The system as claimed in claim 2, wherein the control terminal of the buffering unit within the $N^{th}$ shift register is coupled to the first clock signal, and the control terminal of the buffering unit within the $N+1^{th}$ shift register is coupled to the second clock signal.

4. The system as claimed in claim 3, wherein the buffering unit in the $N^{th}$ shift register is operative to output one pulse of the first clock signal to serve as the corresponding driving pulse according to the first and second control signals, and the buffering unit in the $N+1^{th}$ shift register is operative to output one pulse of the second clock signal to serve as the corresponding driving pulse according to the first and second control signals.

5. The system as claimed in claim 3, wherein the $N^{th}$ shift register is configured to be reset by the second clock signal, and the $N+1^{th}$ shift register is configured to be reset by the first clock signal.

6. The system as claimed in claim 1, wherein each of the PMOS shift registers further comprises an electrostatic discharge circuit coupled to an output terminal of the corresponding buffering unit.

7. The system as claimed in claim 1, further comprising a display panel; and wherein the signal driving circuit is located on the display panel.

8. A system for displaying images comprising:
a display device comprising:
a signal driving circuit comprising a plurality of PMOS shift registers connected in series and controlled only by a first clock signal and a second clock signal, wherein the PMOS shift registers are operative to output corresponding driving pulses in turn after receiving a start pulse;
wherein the corresponding driving pulse output from an $N^{th}$ register of the PMOS shift registers is output to an $N+1^{th}$ register of the PMOS shift registers and serves as a corresponding start pulse of the $N+1^{th}$ register of the PMOS shift registers, the $N^{th}$ register of the PMOS shift registers outputs a corresponding driving pulse based on the first clock signal responsive to receiving a corresponding driving pulse from an $N-1^{th}$ register of the PMOS shift registers, and the $N+1^{th}$ register of the PMOS shift registers outputs a corresponding driving pulse based on the second clock signal responsive to receiving a corresponding driving pulse from the $N^{th}$ register of the PMOS shift registers, and the PMOS shift registers each comprise:
a control unit comprising:
a first switch element having a first connecting terminal coupled to one of the first and second clock signals, a second connecting terminal, and a control terminal coupled to a first node;
a second switch element having a first connecting terminal coupled to the second connecting terminal of the first switch element, a second connecting terminal coupled to a supply voltage, and a control terminal coupled to a second node;
a third switch element having a first connecting terminal coupled to the other of the first and second clock signals, a second connecting terminal coupled to the second node, and a control terminal coupled to the first connecting terminal thereof;
a fourth switch element having a first connecting terminal coupled to the start pulse or the corresponding start pulse, a second connecting terminal coupled to the first node, and a control terminal coupled to the first connecting terminal thereof;
a fifth switch element having a first connecting terminal coupled to the second node, a second connecting terminal coupled to the supply voltage, and a control terminal coupled to the first connecting terminal of the fourth switch element; and a sixth switch element having a first connecting terminal coupled to the first node, a second connecting terminal coupled to the supply voltage, and a control terminal coupled to the first connecting terminal of the fifth switch element;

wherein the control unit is operative to generate first and second control signals at the first and second nodes respectively in response to receiving the start pulse or the corresponding start pulse;

a buffering unit comprising a control terminal coupled to the first clock signal or the second clock signal, and the buffing unit being operative to output the coupled clock signal to serve as the corresponding driving pulse, according to the first and second control signals, wherein the corresponding driving pulse output from the buffer unit in the $N^{th}$ register of the PMOS shift registers is output to the control unit in the $N+1^{th}$ register of the PMOS shift registers and serves as the corresponding start pulse of the $N+1^{th}$ register of the PMOS shift register; and a display element coupled to the signal driving circuit, wherein the display element is driven by the signal driving circuit, wherein each of the first through sixth switch elements comprises a first PMOS transistor connected in series with a second PMOS transistor, and first terminals of the first and second PMOS transistors are coupled together, gates of which are coupled together to serve as the control terminal, and second terminals of the first and second PMOS transistors serve as the first and second connecting terminals respectively.

9. The system as claimed in claim 8, wherein the display element is a liquid crystal display element.

10. The system as claimed in claim 8, further comprising:
a DC/DC converter coupled to the display device and operative to power the display device.

11. The system as claimed in claim 10, further comprising means for powering the display device.

12. The system as claimed in claim 10, wherein the display device is an organic light emitting display device.

13. The system as claimed in claim 10, wherein the system is an electronic device.

14. The system as claimed in claim 13, wherein the electronic device is one of a digital camera, a portable DVD, a television, a car display, a PDA, a display monitor, a notebook computer, a tablet computer, or a cellular phone.

\* \* \* \* \*